United States Patent [19]
Twichell et al.

[11] Patent Number: 6,028,424
[45] Date of Patent: Feb. 22, 2000

[54] LINEARIZED OPTICAL SAMPLER

[75] Inventors: Jonathan C. Twichell, Acton; Roger J. Helkey, Chelmsford, both of Mass.

[73] Assignee: Massachuetts Institute of Technology, Cambridge, Mass.

[21] Appl. No.: 09/286,950

[22] Filed: Apr. 6, 1999

Related U.S. Application Data

[62] Division of application No. 08/792,551, Jan. 31, 1997, Pat. No. 5,955,875.

[51] Int. Cl.[7] .................................................. G02F 1/035
[52] U.S. Cl. .................................................. 324/96; 324/753
[58] Field of Search .............................. 324/96, 750, 753, 324/244.1; 250/227.14; 356/351, 352; 359/245, 237–239, 257; 385/3, 16

[56] References Cited

U.S. PATENT DOCUMENTS

| | | | |
|---|---|---|---|
| H353 | 10/1987 | Taylor ............................... | 340/347 AD |
| 4,446,425 | 5/1984 | Valdmanis et al. .................... | 324/77 K |
| 4,468,766 | 8/1984 | Spezio ................................. | 370/3 |
| 4,695,790 | 9/1987 | Mathis ................................. | 324/77 |
| 5,010,346 | 4/1991 | Hamilton et al. ...................... | 341/137 |
| 5,017,793 | 5/1991 | Halsey et al. ......................... | 250/551 |
| 5,031,235 | 7/1991 | Raskin et al. . | |
| 5,146,075 | 9/1992 | Kim et al. ............................. | 250/211 |
| 5,148,503 | 9/1992 | Skeie ................................... | 385/3 |
| 5,155,352 | 10/1992 | Kim et al. ............................. | 250/211 |
| 5,199,086 | 3/1993 | Johnson et al. ........................ | 385/2 |
| 5,249,243 | 9/1993 | Skeie ................................... | 385/3 |
| 5,280,168 | 1/1994 | Kim et al. ............................. | 250/214 |
| 5,548,433 | 8/1996 | Smith ................................... | 359/158 |
| 5,625,727 | 4/1997 | Liedenbaum et al. ................... | 385/16 |
| 5,644,665 | 7/1997 | Burns et al. ........................... | 385/3 |

FOREIGN PATENT DOCUMENTS 2245715A 1/1992 United Kingdom ............. G02F 1/35

OTHER PUBLICATIONS

D.H. Auston et al., "Picosecond Optoelectronic Detection, Sampling, and Correlation Measurements in Amorphous Semiconductors" *Appl. Phys. Lett. 37* (4):371–373 (1980) (month unavailable).

D.M. Bloom, "Subpicosecond Electrooptic Sampling" Interim Report to the Air Force Office of Scientific Research of a Program of Research in Subpicosecond Electrooptic Sampling, Contract #F49620–92–J–0099, Edward L. Glinzton Lab., W.W. Hansen Labs. of Physics of Stanford University, Stanford, CA (1993) (month unavailable).

A.G. Foyt et al., "Picosecond InP Optoelectronic Switches" *Appl. Phys. Lett. 40* (6);447–449 (1982).

R. Hofmann et al., "Electro–Optic Sampling System for the Testing of High–Speed Integrated Circuits Using a Free Running Solid–State Laser" *J. of Lightwave Tech. 14* (8):1788–1793 (1996). (month unavailable).

H.F. Taylor, "Extended Precision in Video–Bandwidth Analogue/Digital Converters using Optical Techniques", *Electronics Letters* 20(8):352–353 (1984) (month unavailable).

(List continued on next page.)

*Primary Examiner*—Vinh P. Nguyen
*Attorney, Agent, or Firm*—Testa, Hurwitz & Thibeault, LLP

[57] ABSTRACT

A linearized optical sampler is described. The optical sampler includes an electro-optic modulator having an optical signal input, an electrical signal input, and at least two optical signal outputs that generate at least two modulated optical signals. The optical sampler also includes at least two detectors each of which being optically coupled to a respective one of the at least two modulated optical signals. Each detector generates an electrical signal in response to an optical intensity of the respective one of the at least two modulated optical signals. The optical sampler also includes a signal processor electrically connected to each of the at least two detectors. The signal processor applies an inverse transform of the modulator transfer function. The signal processor also generates an electrical signal from the electrical signals generated by the detectors and from the inverse transform that is linearly related to an RF signal electrically that is coupled to the electrical signal input.

16 Claims, 4 Drawing Sheets

OTHER PUBLICATIONS

M.J. Taylor et al., "High–Speed Electro–Optic Analog–to–Digital Converter" Technical Report 351 of Naval Ocean Systems Center, San Diego, CA (1978). (month unavailable).

J.R. Teague et al., "Advanced Modulator II" Technical Report AFAL–TR–74–17 of McDonnell Douglas Astronautics Company—East and McDonnell Douglas Corporation, St. Louis, MO (1974) (month unavailable).

J.A. Bell et al., "Extension of Electronic A/D Converters to Multi–Gigahertz Sampling Rates Using Optical Sampling and Demultiplexing Techniques" Asilomar Conference on Signals, Systems and Computers (Oct. 1989)

J.A. Bell et al., "A/D Conversion of Microwave Signals Using a Hybrid Optical/Electronic Technique" *SPIE* *1476*:326–329 (1991) (month unavailable).

L. Goldberg et al., "Generation and Control of Microwave Signals by Optical Techniques" *IEEE Proceed. J.* *139*:288–295 (1992) (month unavailable).

R.J. Helkey et al., "Millimeter–Wave Signal Generation Using Semiconductor Diode Lasers" *Micro. & Optical Tech. Lett.* *6*(1):1–5 (1993) (month unavailable).

D.C. Ni et al., "Use of Picosecond Optical Pulses and FET's Integrated with Printed Circuit Antennas to Generate Millimeter Wave Radiation" *IEEE Photonics Tech. Lett.3*(3):273–275 (1991) (month unavailable).

D. Novack et al., "Millimetre–Wave Signal Generation Using Pulsed Semiconductor Lasers" *Electronics Letters* *30*(17):1430–1431 (1994) (month unavailable).

D. Novack et al., "Signal Generation Using Pulsed Semiconductor Lasers for Application in Millimeter–Wave Wireless Links" *IEEE Trans. on Microwave Theory & Techniques* *43*(9):2257–2262 (1995). (month unavailable).

H. Ogawa, "Application of Optical Techniques to Microwave Signal Processing (MSP)—Optical–Microwave Signal Processing" *IEEE Trans. Electron. E79*(1):87–97 (1996) (month unavailable).

H.F. Taylor, "An Electrooptic Analog–to–Digital Converter" *Proc. of IEEE,* pp. 1524–1525 (1975) (month unavailable).

H.F. Taylor, "An Optical Analog–to–Digital Converter Design and Analysis" *IEEE J. Quantum Electronics QE–15*(4) (1979) (month unavailable).

K. Takeuchi et al., "High–Speed Optical Sampling Measurement of Electrical Wave Form Using a Scanning Tunneling Microscope" *Appl. Phys. Lett.* *63*(26):3548–3549 (1993) (month unavailable).

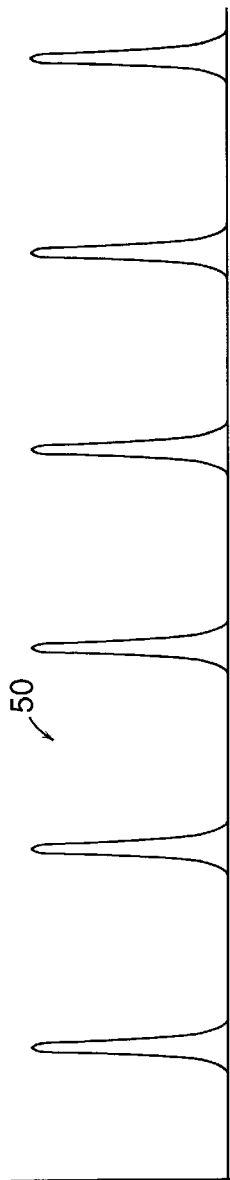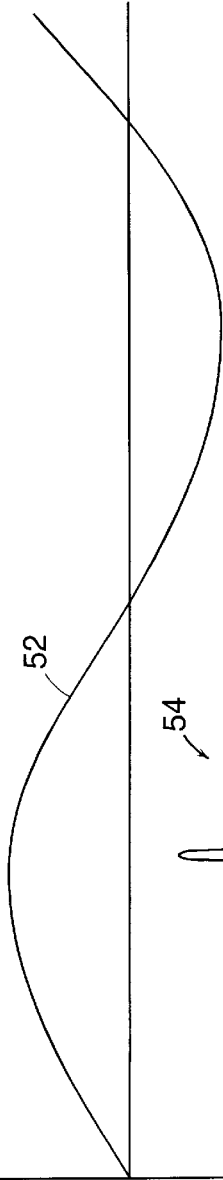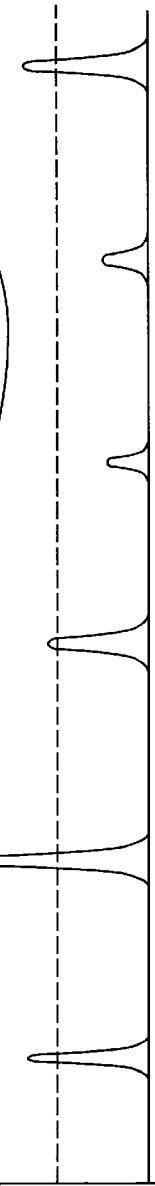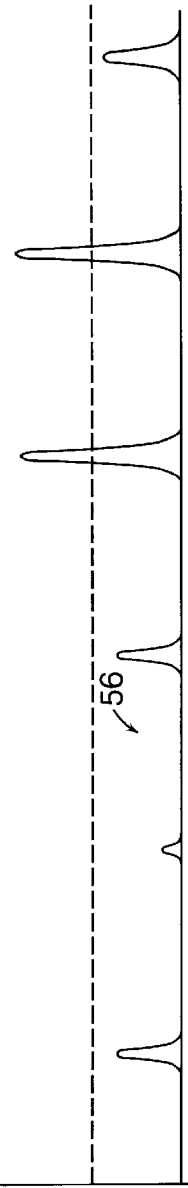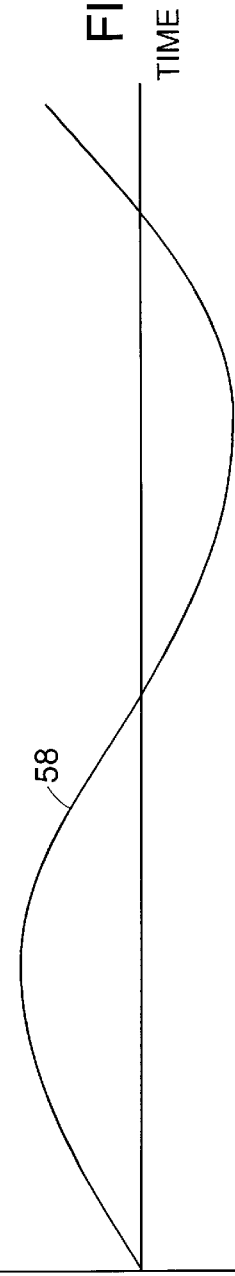

LINEARIZED OPTICAL SAMPLER

CROSS REFERENCE TO RELATED APPLICATION

This application is a divisional of U.S. Ser. No. 08/792,551 filed on Jan. 31, 1997, now U.S. Pat. No. 5,955,875, the disclosure of which is incorporated herein by reference.

GOVERNMENT SUPPORT

This invention was made with government support under Contract Number F19628-95-C-0002 awarded by the Air Force. The government has certain rights in the invention.

FIELD OF THE INVENTION

The invention relates generally to the field of optical sampling of electrical signals. In particular, the invention relates to apparatus and methods for optical sampling of time dependent electrical signals.

BACKGROUND OF THE INVENTION

Sampling is widely used in modem electronics for converting a continuous-time signal into a discrete-time signal. Analog-to-digital converters use sampling to convert a continuous range of analog signal levels into digital codes. Such conversions are necessary to interface real-world systems, which typically monitor continuously varying analog signals, with digital systems that process, store, interpret, and manipulate digital sampled values. Signal mixers for radio frequency and radar receivers may also use sampling. In addition, sampling may be used in signal processing for many applications, such as removing noise.

Many applications require precise sampling. For example, analog-to-digital converters must sample the input signal precisely to provide the quantizer a stable signal to digitize. Imprecise sampling is typically caused by both nonlinearities in the signal path or variations in the sampling timing. Optical sampling techniques have been proposed for applications that require high-speed, precise sampling. Optical sampling is advantageous because it can be linearized and because it can have highly precise sampling time stability.

Recently, the use of electro-optic modulators for optical sampling has been proposed. The performance of such prior art optical sampling techniques is, however, limited by intensity nonlinearities inherent in the electro-optic modulators, fluctuations in optical pulse power, and phase bias variation in the modulators.

SUMMARY OF THE INVENTION

It is therefore a principal object of this invention to improve the sampling precision of optical sampling systems using electro-optic modulators. It is a principal discovery of this invention that high-speed digital signal processing can be used to perform linearization in an optical sampling system using an electro-optic modulator.

Accordingly, the present invention features an apparatus for sampling an electrical signal. The apparatus includes an electro-optic modulator having an optical signal input, an electrical signal input, and at least two optical signal outputs that generate at least two modulated optical signals. The modulator may be an electro-optic interferometric modulator such as a Mach-Zehnder, Fabry-Perot, or polarization interferometric modulator. The modulator may also be a directional coupler. The modulator may be formed on a monolithically integrated substrate.

The apparatus also includes at least two detectors, each of which is optically coupled to a respective one of the at least two modulated optical signals. Each detector generates an electrical signal in response to an optical intensity of the respective one of the at least two modulated optical signals.

In addition, the apparatus includes a signal processor electrically connected to each of the at least two detectors. The signal processor generates an electrical signal from the electrical signals generated by the at least two detectors and from a predetermined inverse transform of the modulator transfer function. The signal processor may include an analog signal processor for detector offset and gain correction. The electrical signal generated by the signal processor is linearly related to an RF signal electrically coupled to the electrical signal input. The signal processor may include at least one analog-to-digital converter that converts the electrical signals generated by the detectors to digital signals.

The apparatus may include a modulated optical source that is optically coupled to the optical signal input that generates an input optical signal. The modulated optical source may generate a pulse train. The modulated optical source may be any short pulse laser source such as a mode-locked laser or a gain-switched laser. The modulated optical source may also be any sinusoidally varying optical signal source such as a laser with two optical modes or a CW laser followed by an optical modulator.

The present invention also features a method of measuring an electrical signal. The method includes providing an electro-optic modulator having an optical signal input, an electrical signal input, and at least two optical signal outputs that generate at least two modulated optical signals. An input RF signal is applied to the electrical signal input. An optical source that generates an input optical signal may be coupled to the optical signal input. The optical source may be modulated at a frequency substantially different than a center frequency of the input RF signal to alias a bandwidth of interest to a different frequency.

The method also includes generating electrical signals in response to the at least two modulated optical signals. An electrical signal is then generated from the electrical signals generated in response to the at least two modulated optical signals and from a predetermined inverse transform of the modulator transfer function. The electrical signal is linearly related to an RF signal that is electrically coupled to the electrical signal input.

The method may include the step of determining the inverse transform of the modulator transfer function by inverting an analytic expression for the transfer function. The method may also include the step of determining the inverse transform of the modulator transfer function by representing the modulator transfer function as a series expansion and determining the inverse transform of the series expansion. A Taylor Series expansion may be used. The inverse transform may also be determined by recalling the inverse transform from a look-up table containing predetermined data.

The present invention features another apparatus for measuring an electrical signal. The apparatus includes an electro-optic modulator having an optical signal input, an electrical signal input, and at least one optical signal output that generates at least one modulated optical signal. The modulator may be an electro-optic interferometric modulator such as a Mach-Zehnder, Fabry-Perot, or polarization interferometric modulator. The modulator may also be an electro-absorption modulator or a directional coupler. The modulator may be formed on a monolithically integrated substrate.

The apparatus also includes a first detector optically coupled to the optical signal input that generates an electrical signal corresponding to an intensity of an input optical signal. In addition, a second detector is optically coupled to a modulated optical signal chosen from one of the at least one modulated optical signal. The second detector generates an electrical signal in response to an optical intensity of the modulated optical signal.

In addition, the apparatus includes a signal processor operatively coupled to the first and second detector that applies an inverse transform of the modulator transfer function. The signal processor may also determine the inverse transform of the modulator transfer function. The signal processor generates an electrical signal from the electrical signals generated by the first and second detectors and from the inverse transform. The electrical signal that is generated by the signal processor is linearly related to an RF signal that is electrically coupled to the electrical signal input. The signal processor may include at least one analog-to-digital converter that converts the at least two electrical signals generated by the detectors to digital signals.

The apparatus may include a modulated optical source that is optically coupled to the optical signal input and that generates an input optical signal. The modulated optical source may generate a pulse train. The modulated optical source may be any short pulse laser source such as a mode-locked laser or a gain-switched laser. The modulated optical source may also be any sinusoidally varying optical signal source such as a laser with two optical modes or a CW laser followed by an optical modulator.

The present invention also features another method of measuring an electrical signal. The method includes providing an electro-optic modulator having an optical signal input, an electrical signal input, and at least one optical signal output that generates at least one modulated optical signal. An input RF signal is applied to the electrical signal input. An optical source that generates an input optical signal may be coupled to the optical signal input. The optical source may be modulated at a frequency substantially different than a center frequency of the input RF signal to alias a bandwidth of interest to a different frequency.

The method also includes generating an electrical signal in response to an intensity at an optical signal output chosen from one of the at least one optical signal outputs. An electrical signal is generated from the electrical signal generated in response to: an intensity at the optical signal input; an intensity at an optical signal output chosen from one of the at least one optical signal output; and from a predetermined inverse transform of the modulator transfer function. The electrical signal generated is linearly related to an RF signal that is electrically coupled to the electrical signal input.

The method may also include determining the inverse transform of the modulator transfer function. The inverse transform may be determined by representing the modulator transfer function as a series expansion and determining the inverse transform of the series expansion. A Taylor Series expansion may be used. The inverse transform may also be determined by recalling the inverse transform from a look-up table containing predetermined data.

The present invention also features another apparatus for measuring an electrical signal. The apparatus includes a linearized electro-optic modulator having an optical signal input, an electrical signal input, and at least one optical signal output that generates at least one modulated optical signal. The modulator may be a compound modulator that generates a linearized output with respect to the electrical input. The compound modulator may be at least two series modulators, at least one reflective half-coupler modulator, or at least one reflective full-coupler modulator. The compound modulator may also be a directional coupler with one or more electrodes.

The apparatus also includes at least two detectors. Each of the at least two detectors are optically coupled to a respective one of the optical signal input and the at least one modulated optical signal. Each detector generates an electrical signal in response to an optical intensity at the optical signal input and of the least one modulated optical signal.

The apparatus also includes a signal processor operatively coupled to each detector that applies an inverse transform of the interferometric modulator transfer function. The signal processor generates an electrical signal from the electrical signals generated by the at least two detectors and from the inverse transform. The electrical signal generated by the signal processor has substantially zero intermodulation distortion and is linearly related to an RF signal electrically coupled to the electrical signal input.

BRIEF DESCRIPTION OF THE DRAWINGS

This invention is described with particularity in the appended claims. The above and further advantages of this invention may be better understood by referring to the following description taken in conjunction with the accompanying drawings, in which:

FIG. 2a–2e illustrate the operation of the optical sampler of FIG. 1.

DETAILED DESCRIPTION

Figure 1:
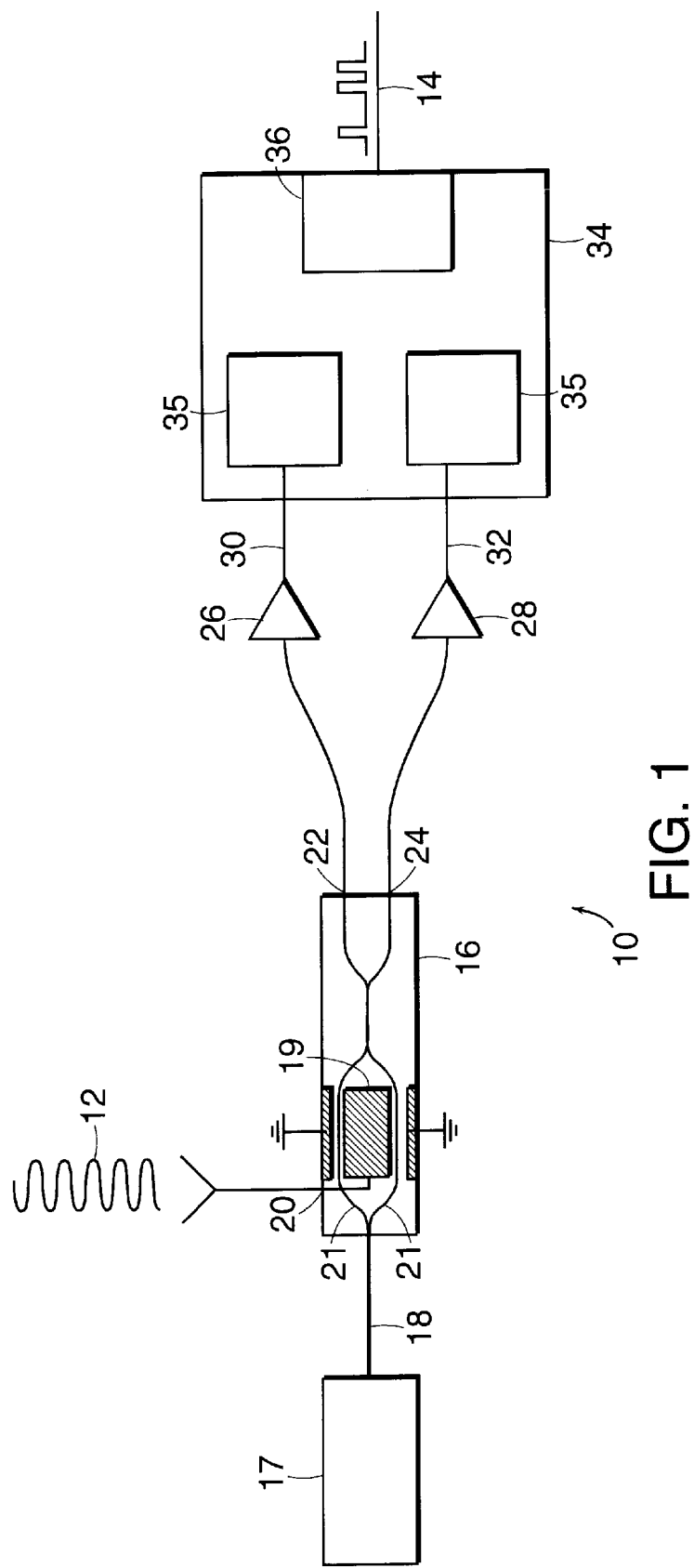
FIG. 1 is a schematic representation of a linearized optical sampler that embodies the invention.

FIG. 1 is a schematic representation of a linearized optical sampler 10 that embodies the invention. The optical sampler 10 samples an input RF signal 12 and generates a digital code 14 that is a representation of the input RF signal 12. The optical sampler 10 may be formed on a monolithically integrated substrate.

One embodiment of the optical sampler 10 includes an electro-optic modulator 16 having an optical signal input 18, an electrical signal input 20, and a first 22 and second optical signal output 24 that generate a first and a second modulated optical signal, respectively. The modulator 16 may be an electro-optic interferometric modulator such as a Mach-Zehnder, Fabry-Perot, or polarization interferometric modulator. The modulator 16 may also be a directional coupler.

FIG. 1 illustrates a Mach-Zehnder interferometric modulator that uses a phase shifter 19. The phase shifter 19 imposes a phase shift between the optical beam traveling in the arms 21. The phase shift may be extremely linear with the applied electric field. The output of the interferometer encodes the phase shift in a well known sinusoidal amplitude dependence. The phase shift in the arms 21 can be accurately determined by measuring the amplitude of the first and second modulated optical signals independent of many error mechanisms which distort the modulated optical signals.

Although the modulator 16 is described as a Mach-Zehnder interferometer, it is noted that many other electrooptic modulators can be used without departing from the spirit and scope of the invention. In particular, there are many possible implementations of interferometric and non-interferometric modulators that can be used to encode an electrical signal on an optical signal.

A modulated optical source 17 is optically coupled to the optical signal input 18. The modulated optical source 17 generates an input optical signal that may be a pulse train. The modulated optical source 17 may be any short pulse laser source such as a mode-locked laser or a gain-switched laser. The modulated optical source may also be any sinusoidally varying optical signal source such as a laser with two optical modes or a CW laser followed by an optical modulator.

A first 26 and a second detector 28 are optically coupled to the first 22 and second optical signal output 24, respectively of the modulator 16. The first 26 and second detector 28 each generate an electrical signal at a first 30 and a second detector output 32, respectively that is in response to an optical intensity of the first and second modulated optical signals, respectively.

A signal processor 34 is electrically connected to the first 30 and the second detector output 32. The signal processor 34 processes the electrical signals generated by the detectors 26, 28 and applies the inverse transform of the modulator's transfer function. The signal processor 34 generates an electrical signal from the inverse transform that is linearly related to the RF signal 12.

The signal processor 34 may include at least one analog-to-digital converter 35 that converts the electrical signal at the first 30 and the second detector output 32 to digital signals. The signal processor 34 may also include at least one digital-to-analog converter 36 that converts the digital signals processed by the signal processor 34 to at least one analog signal that is linearly related to the RF signal 12. The signal processor may operate as part of a more complex signal processing system.

FIG. 2 illustrates the operation of the optical sampler of FIG. 1. FIG. 2a illustrates a short pulse train 50 that represents the output of the modulated optical source 17. FIG. 2b illustrates an RF signal 52 that is applied to the electrical signal input 20 of the modulator 16. FIG. 2c illustrates a first modulated optical signal 54 that is amplitude modulated by the RF signal 52. FIG. 2d illustrates a second modulated optical signal 56 that is amplitude modulated by the RF electrical signal 52. The first 54 and second modulated optical signal 56 are short pulse trains having amplitudes modulated by the RF signal mapped by the modulator's transfer function.

The first 54 and second modulated optical signal 56 are detected by detectors 26, 28 and converted to digital signals by analog-to-digital converters. The resulting digital signals are processed by the signal processor 34. The signal processor 34 determines, from the known transfer function of the phase shifter 19, the applied voltage of the RF signal 52 during the time intervals that pulses from the short pulse train 50 were traversing the arms 21 of the Mach-Zehnder interferometer 16. The inverse transform may be determined by representing the modulator transfer function as a series expansion and determining the inverse transform of the series expansion. For example, a Taylor Series expansion may be used. The inverse transform may also be determined by recalling the inverse transform from a look-up table containing predetermined data. FIG. 2e illustrates a recovered electrical signal 58 that is linearly related to the RF signal 52.

The optical sampling technique of the present invention has numerous advantages. For example, linearization is performed by a high-speed digital signal processor. Also, the timing jitter of present invention is limited only by the timing jitter of the modulated optical source. Modem mode locked lasers offer timing precision in the tens of femtosecond regime. This is sufficient to sample gigahertz signals with 14 bits of precision. In addition, the measurement of the phase shift at the interferometer is largely independent of the input pulse amplitude. Therefore, the sampling technique of the present invention is relatively insensitive to amplitude noise in the laser.

Figure 3:
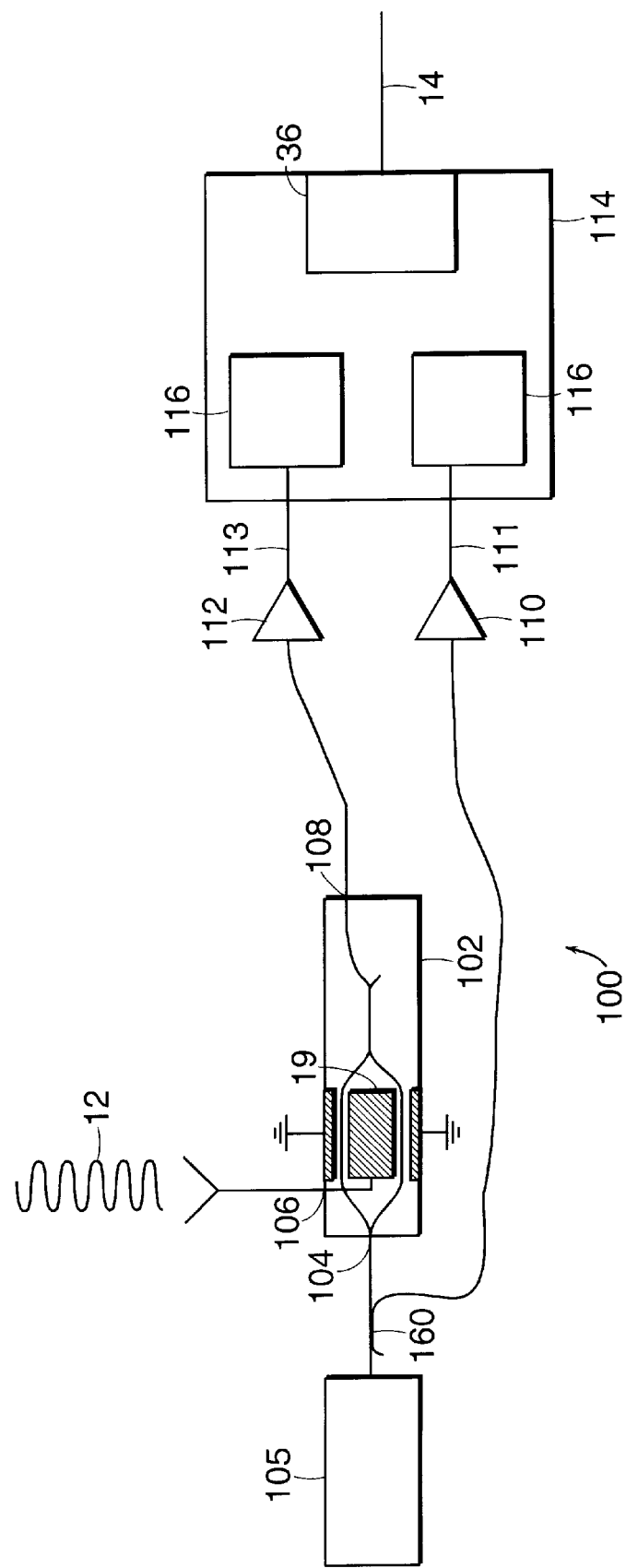
FIG. 3 is a schematic representation of a second linearized optical sampler that embodies the invention.

FIG. 3 is a schematic representation of a second linearized optical sampler 100 that embodies the invention. The optical sampler 100 is similar to the optical sampler 10 of FIG. 2. The optical sampler 100 includes an electro-optic modulator 102 comprising a Mach-Zehnder interferometer. The modulator 102 may be any other type of electro-optic modulator. In addition, the modulator 102 may also be an electro-absorption modulator or a directional coupler. The modulator 102 may be formed on a monolithically integrated substrate. The modulator 102 includes an optical signal input 104, an electrical signal input 106, and an optical signal output 108 that generate a modulated optical signal.

The optical sampler 100 includes a modulated optical source 105 that is optically coupled to the optical signal input 104. The optical source 105 generates an input optical signal that may be a short pulse train. The optical source 105 may be any short pulse laser source such as a mode-locked laser or a gain-switched laser. The optical sampler 100 also includes a first detector 110 that is optically coupled to the optical signal input 104. The first detector 110 generates an electrical signal at a first detector output 111 that corresponds to an intensity of the input optical signal. In addition, a second detector 112 is optically coupled to the optical signal output 108. The second detector 112 generates an electrical signal at a second detector output 113 in response to an optical intensity of the modulated optical signal.

In addition, the optical sampler 100 includes a signal processor 114 that is coupled to the first 111 and second detector output 113 that applies an inverse transform of the modulator transfer function. The signal processor 114 generates an electrical signal from the inverse transform and from the electrical signals generated by the first 110 and second detector 112 that is linearly related to an RF signal electrically coupled to the electrical signal input. The signal processor 114 may include at least one analog-to-digital converter 116 that converts the electrical signals generated by the detectors to digital signals.

Figure 4:
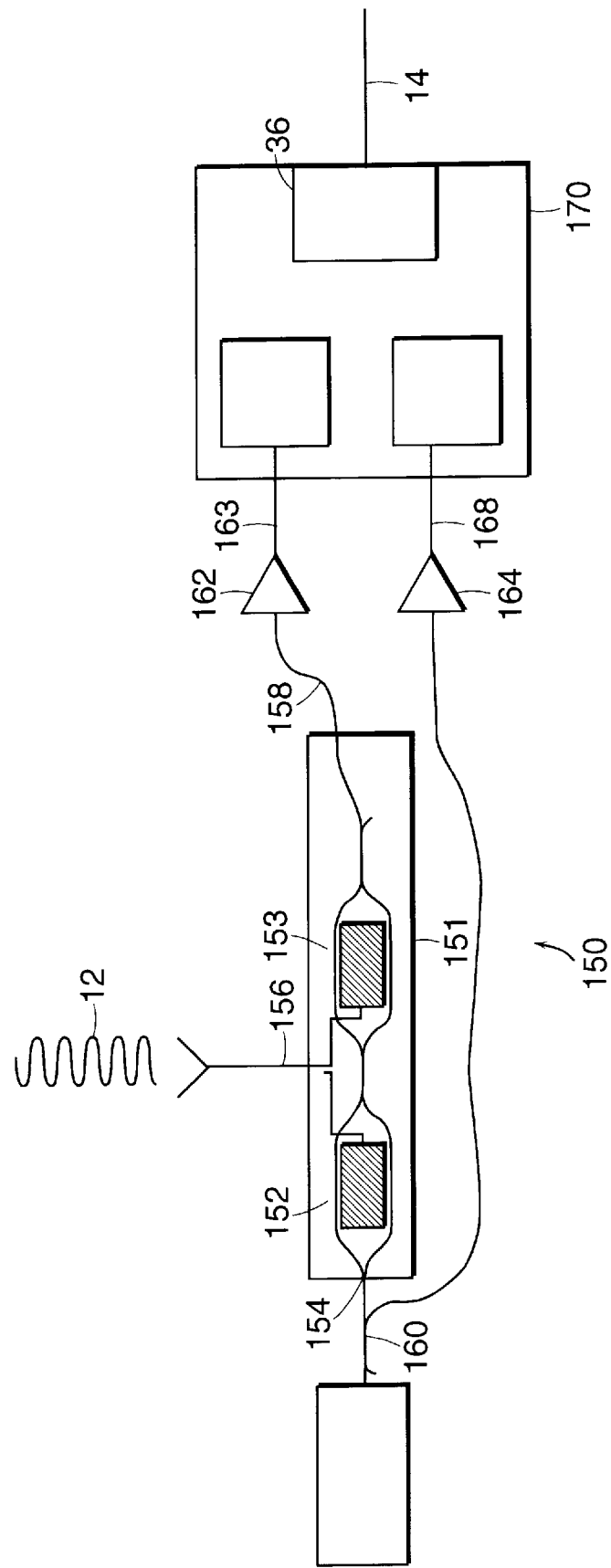
FIG. 4 is a schematic representation of a third linearized optical sampler that embodies the invention.

FIG. 4 is a schematic representation of a third linearized optical sampler 150 that embodies the invention. The optical sampler 150 includes a compound modulator 151 that generates a linearized output with respect to an electrical input. The compound modulator 151 includes a first 152 and a second modulator 153 connected in series. The first 152 and second modulator 153 may comprise at least one reflective half-coupler modulator, or at least one reflective full-coupler modulator. The compound modulator 151 includes an optical signal input 154, an electrical signal input 156, and signal output 158 that generates a modulated optical signal.

The linearized optical sampler 150 also includes a first 162 and a second detector 164 that are optically coupled to a respective one of the optical signal input 154 and the signal output 158 of the compound modulator 151. A partial optical coupler 160 is used to couple a portion of light incident on optical signal input 154 into the second detector 164. The first 162 and second detector 164 generate a first and second detector signal at a first 166 and second detector output 168 in response to an optical intensity of the respective one of the first and second modulated optical signals.

The linearized optical sampler 150 also includes a signal processor 170 that is coupled to the first 162 and second detector 164. The signal processor 170 applies an inverse transform of the interferometric modulator transfer function. The signal processor 170 generates a resulting signal from both the inverse transform and from the first and second detector signals that has substantially zero intermodulation distortion and which is linearly related to an RF signal electrically coupled to the electrical signal input.

The linearized optical sampling techniques of the present invention have numerous applications. For example, the sampling techniques of the present invention can be used in a high-speed, high-precision analog-to-digital converter. The sampling techniques of the present invention can also be used in a down conversion optical link where the modulated optical source and the down-converted optical signal detection and processing are separated physically by a long distance. Down conversion or mixing can be accomplished by slightly offsetting the frequency of the optical modulation source from a narrow-band signal frequency of interest in order to down-convert the signal of interest. Using such a technique in an optical sampling apparatus will reduce the number of samples that must be digitized and processed, as well as reduce the required laser power.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An apparatus for measuring an electrical signal comprising:
   a) an electro-optic modulator having a modulator transfer function and an inverse transform of the modulator transfer function, the modulator comprising:
      i) an optical signal input for receiving an input optical signal having an input optical signal intensity;
      ii) an electrical signal input; and
      iii) at least one optical signal output that provides at least one modulated optical signal;
   b) a first detector optically coupled to the optical signal input that generates an electrical signal corresponding to the input optical signal intensity;
   c) a second detector optically coupled to one of the at least one optical signal output, the second detector generating an electrical signal in response to an optical intensity of the one of the at least one modulated optical signal; and
   d) a signal processor in electrical communication with the first and second detectors, the signal processor applying the inverse transform of the modulator transfer function and generating an electrical signal in response to the electrical signals generated by the first and second detectors and from the inverse transform of the modulator transfer function, the electrical signal being linearly related to an electrical signal applied to the electrical signal input of the electro-optic modulator.

2. The apparatus of claim 1 further comprising a modulated optical source optically coupled to the optical signal input that generates an input optical signal.

3. The apparatus of claim 2 wherein the modulated optical source comprises a mode-locked laser or a gain-switched laser.

4. The apparatus of claim 2 wherein the modulated optical source comprises a sinusoidally modulated laser source.

5. The apparatus of claim 1 wherein the electro-optic modulator comprises an interferometric modulator.

6. The apparatus of claim 1 wherein the electro-optic modulator comprises an electro-absorption modulator.

7. The apparatus of claim 1 wherein the electro-optic modulator is formed on a monolithically integrated substrate.

8. The apparatus of claim 1 wherein the signal processor includes at least one analog-to-digital converter that converts the electrical signals generated by the detectors to digital signals.

9. The apparatus of claim 1 wherein the electrical signal is linearly related to an electrical signal applied to the electrical signal input and having substantially zero intermodulation distortion.

10. The apparatus of claim 9 wherein the modulator comprises a compound modulator that generates a linearized output with respect to the electrical input.

11. The apparatus of claim 10 wherein the compound modulator comprises at least two series modulators, at least one reflective half-coupler modulator, at least one reflective full-coupler modulator, a directional coupler modulator, or two parallel modulators.

12. A method of measuring an electrical signal comprising:
   a) providing an electro-optic modulator having a modulator transfer function and a predetermined inverse transform of the modulator transfer function, the modulator comprising:
      i) an optical signal input for receiving an input optical signal having an input optical signal intensity;
      ii) an electrical signal input; and
      iii) at least one optical signal output that provides at least one modulated optical signal;
   b) applying an electrical signal to the electrical signal input;
   c) generating an electrical signal in response to the input optical signal intensity;
   d) generating an electrical signal in response to an optical intensity of the one of the at least one modulated optical signal; and
   e) generating an electrical signal in response to the electrical signals generated in steps c) and d) and from the predetermined inverse transform of the modulator transfer function, the electrical signal being linearly related to an electrical signal applied to the electrical signal input.

13. The method of claim 12 further comprising the step of providing an optical source, the source generating an input optical signal.

14. The method of claim 12 further comprising the step of determining an inverse transform of the modulator transfer function prior to step d).

15. The method of claim 14 wherein the step of determining the inverse transform comprises representing the modulator transfer function as a series expansion and determining the inverse transform of the series expansion.

16. The method of claim 14 wherein the step of determining the inverse transform comprises recalling the inverse transform from a look-up table containing predetermined data.

* * * * *